(12) United States Patent
Chae et al.

(10) Patent No.: US 7,919,398 B2
(45) Date of Patent: Apr. 5, 2011

(54) MICROCRYSTALLINE SILICON DEPOSITION FOR THIN FILM SOLAR APPLICATIONS

(75) Inventors: Yong Kee Chae, Pleasanton, CA (US); Soo Young Choi, Fremont, CA (US); Shuran Sheng, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 145 days.

(21) Appl. No.: 12/493,020

(22) Filed: Jun. 26, 2009

(65) Prior Publication Data
US 2009/0263930 A1 Oct. 22, 2009

Related U.S. Application Data

(63) Continuation of application No. 11/876,173, filed on Oct. 22, 2007, now abandoned.

(51) Int. Cl.
*H01L 21/20* (2006.01)
(52) U.S. Cl. .............. 438/486; 438/96; 438/94; 438/97; 438/73; 438/57; 438/458; 257/E21.002; 257/E21.133; 257/E31.045; 257/E31.061; 257/E21.566
(58) Field of Classification Search .................... 438/96, 438/486, 97, 73, 57, 458, 94; 257/E21.002, 257/E21.133, E31.045, E31.061, E21.566
See application file for complete search history.

(56) References Cited

U.S. PATENT DOCUMENTS

| | | | |
|---|---|---|---|
| 4,471,155 A | | 9/1984 | Mohr et al. |
| 4,728,370 A | | 3/1988 | Ishii et al. |
| 5,021,100 A | * | 6/1991 | Ishihara et al. ............... 136/249 |
| 5,252,142 A | * | 10/1993 | Matsuyama et al. .......... 136/255 |
| 5,256,887 A | * | 10/1993 | Yang ................................ 257/53 |
| 5,507,881 A | * | 4/1996 | Sichanugrist et al. ........ 136/258 |
| 5,677,236 A | * | 10/1997 | Saitoh et al. .................. 438/485 |
| 5,700,467 A | * | 12/1997 | Shima et al. .................. 136/249 |
| 5,720,826 A | * | 2/1998 | Hayashi et al. ............... 136/249 |

(Continued)

FOREIGN PATENT DOCUMENTS

JP 11-87742 3/1999

OTHER PUBLICATIONS

PCT International Search Report and Written Opinion dated Dec. 22, 2008 for International Application No. PCT/US2008/80834. (APPM/012180 PCT).

(Continued)

*Primary Examiner* — N Drew Richards
*Assistant Examiner* — Ankush K Singal
(74) *Attorney, Agent, or Firm* — Patterson & Sheridan, LLP

(57) ABSTRACT

Embodiments of the invention as recited in the claims relate to thin film multi-junction solar cells and methods and apparatuses for forming the same. In one embodiment a method of forming a thin film multi-junction solar cell over a substrate is provided. The method comprises positioning a substrate in a reaction zone, providing a gas mixture to the reaction zone, wherein the gas mixture comprises a silicon containing compound and hydrogen gas, forming a first region of an intrinsic type microcrystalline silicon layer on the substrate at a first deposition rate, forming a second region of the intrinsic type microcrystalline silicon layer on the substrate at a second deposition rate higher than the first deposition rate, and forming a third region of the intrinsic type microcrystalline silicon layer on the substrate at a third deposition rate lower than the second deposition rate.

20 Claims, 8 Drawing Sheets

U.S. PATENT DOCUMENTS

| | | |
|---|---|---|
| 5,913,986 A | 6/1999 | Matsuyama |
| 6,242,686 B1* | 6/2001 | Kishimoto et al. ........... 136/255 |
| 6,242,687 B1* | 6/2001 | Schropp ........................ 136/255 |
| 6,307,146 B1 | 10/2001 | Takeuchi et al. |
| 6,326,304 B1 | 12/2001 | Yoshimi et al. |
| 6,566,159 B2 | 5/2003 | Sawada et al. |
| 6,645,573 B2 | 11/2003 | Higashikawa et al. |
| 6,750,394 B2 | 6/2004 | Yamamoto et al. |
| 7,064,263 B2* | 6/2006 | Sano et al. ..................... 136/249 |
| 7,501,305 B2* | 3/2009 | Takai et al. ..................... 438/57 |
| 7,838,442 B2* | 11/2010 | Sichanugrist et al. ........ 438/787 |
| 2001/0035206 A1 | 11/2001 | Inamasu et al. |
| 2004/0231590 A1* | 11/2004 | Ovshinsky .................... 118/718 |
| 2005/0022864 A1* | 2/2005 | Fujioka et al. ................ 136/258 |
| 2005/0059186 A1* | 3/2005 | Kelly et al. ..................... 438/73 |
| 2005/0085003 A1* | 4/2005 | Kishimoto et al. ............. 438/97 |
| 2005/0103377 A1* | 5/2005 | Saneyuki et al. ............. 136/258 |
| 2005/0173704 A1* | 8/2005 | Saito et al. ....................... 257/64 |
| 2006/0043517 A1* | 3/2006 | Sasaki et al. .................. 257/458 |
| 2007/0298590 A1* | 12/2007 | Choi et al. .................... 438/478 |
| 2008/0173350 A1* | 7/2008 | Choi et al. .................... 136/258 |
| 2008/0188033 A1* | 8/2008 | Choi et al. ....................... 438/96 |
| 2009/0104733 A1 | 4/2009 | Chae et al. |

OTHER PUBLICATIONS

Prosecution History for U.S. Appl. No. 11/876,173.
Notice of Allowance dated Sep. 29, 2009 for U.S. Appl. No. 11/876,173. (APPM/012180US).

* cited by examiner

| INSTRUMENT | PURPOSE | RESULT |
|---|---|---|
| XRD | Crystalline Structure | (111) or (220) |
| | Grain Size | 100-200Å |
| Raman | Crystalline fraction (fc) | ~60% |
| FT-IR | Hydrogen Content | 3-11% |
| Ph/D conductivity | Photosensitivity | ~4x105 (0.5μm) |
| UV/VIS | Optical Band Gap | N/A |
| Electron Spin Resonance (ESR) | Defect Density | $1.2 \times 10^{16}$ |
| Hall measurement | Mobility | (1.37) |
| | Carrier Density | (6.7E15) |
| SIMS | $O_2$ level in a film | $5 \times 10^8$ |
| DR (I layer) | High Dep Rate | 333-700Å/min |

FIG. 8

MICROCRYSTALLINE SILICON DEPOSITION FOR THIN FILM SOLAR APPLICATIONS

CROSS-REFERENCE TO RELATED APPLICATIONS

This application is a continuation of U.S. patent application Ser. No. 11/876,173, filed Oct. 22, 2007, now abandoned which is herein incorporated by reference in its entirety.

BACKGROUND OF THE INVENTION

1. Field of the Invention

Embodiments of the present invention generally relate to solar cells and methods and apparatuses for forming the same. More particularly, embodiments of the present invention relate to thin film multi-junction solar cells and methods and apparatuses for forming the same.

2. Description of the Related Art

Crystalline silicon solar cells and thin film solar cells are two types of solar cells. Crystalline silicon solar cells typically use either mono-crystalline substrates (i.e., single-crystal substrates of pure silicon) or a multi-crystalline silicon substrates (i.e., poly-crystalline or polysilicon). Additional film layers are deposited onto the silicon substrates to improve light capture, form the electrical circuits, and protect the devices. Thin-film solar cells use thin layers of materials deposited on suitable substrates to form one or more p-i-n junctions. Suitable substrates include glass, metal, and polymer substrates.

Microcrystalline silicon film (μC-Si) is one type of film being used to form solar cells. Conventional deposition processes of microcrystalline silicon films have slow deposition rates, which disadvantageously reduce manufacturing throughput and increase production costs.

Therefore, there is a need for an improved method for depositing microcrystalline silicon films.

SUMMARY OF THE INVENTION

Embodiments of the invention as recited in the claims relate to thin film multi-junction solar cells and methods and apparatuses for forming the same. In one embodiment a method of forming a thin film multi-junction solar cell over a substrate is provided. The method comprises positioning a substrate in a reaction zone, providing a gas mixture to the reaction zone, wherein the gas mixture comprises a silicon containing compound and hydrogen gas ($H_2$), forming a first region of an intrinsic type microcrystalline silicon layer on the substrate at a first deposition rate, forming a second region of the intrinsic type microcrystalline silicon layer on the substrate at a second deposition rate higher than the first deposition rate, and forming a third region of the intrinsic type microcrystalline silicon layer on the substrate at a third deposition rate lower than the second deposition rate.

In another embodiment a method of forming a thin film multi-junction solar cell over a substrate is provided. The method comprises forming a first p-i-n junction and forming a second p-i-n junction over the first p-i-n junction. The first p-i-n junction is formed by forming a p-type amorphous silicon layer, forming an intrinsic type amorphous silicon layer over the p-type amorphous silicon layer, and forming a first n-type silicon layer over the intrinsic type amorphous silicon layer. The second p-i-n junction is formed by forming a p-type microcrystalline silicon layer, forming an intrinsic type microcrystalline silicon layer over the p-type microcrystalline silicon layer, and forming a second n-type silicon layer over the intrinsic type microcrystalline silicon layer. The intrinsic type microcrystalline silicon layer is formed by forming a first region of the intrinsic type microcrystalline silicon layer at a first deposition rate, forming a second region of the intrinsic type microcrystalline silicon layer at a second deposition rate higher than the first deposition rate, and forming a third region of the intrinsic type microcrystalline silicon layer at a third deposition rate lower than the second deposition rate. In certain embodiments the first n-type silicon layer is an n-type amorphous/microcrystalline silicon layer. In certain embodiments, the first n-type silicon layer is a microcrystalline silicon layer. In certain embodiments, the second n-type silicon layer is either an amorphous silicon layer or a microcrystalline silicon layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 8 depicts properties of an intrinsic microcrystalline silicon layer deposited according to one embodiment of the invention.

Figure 1:
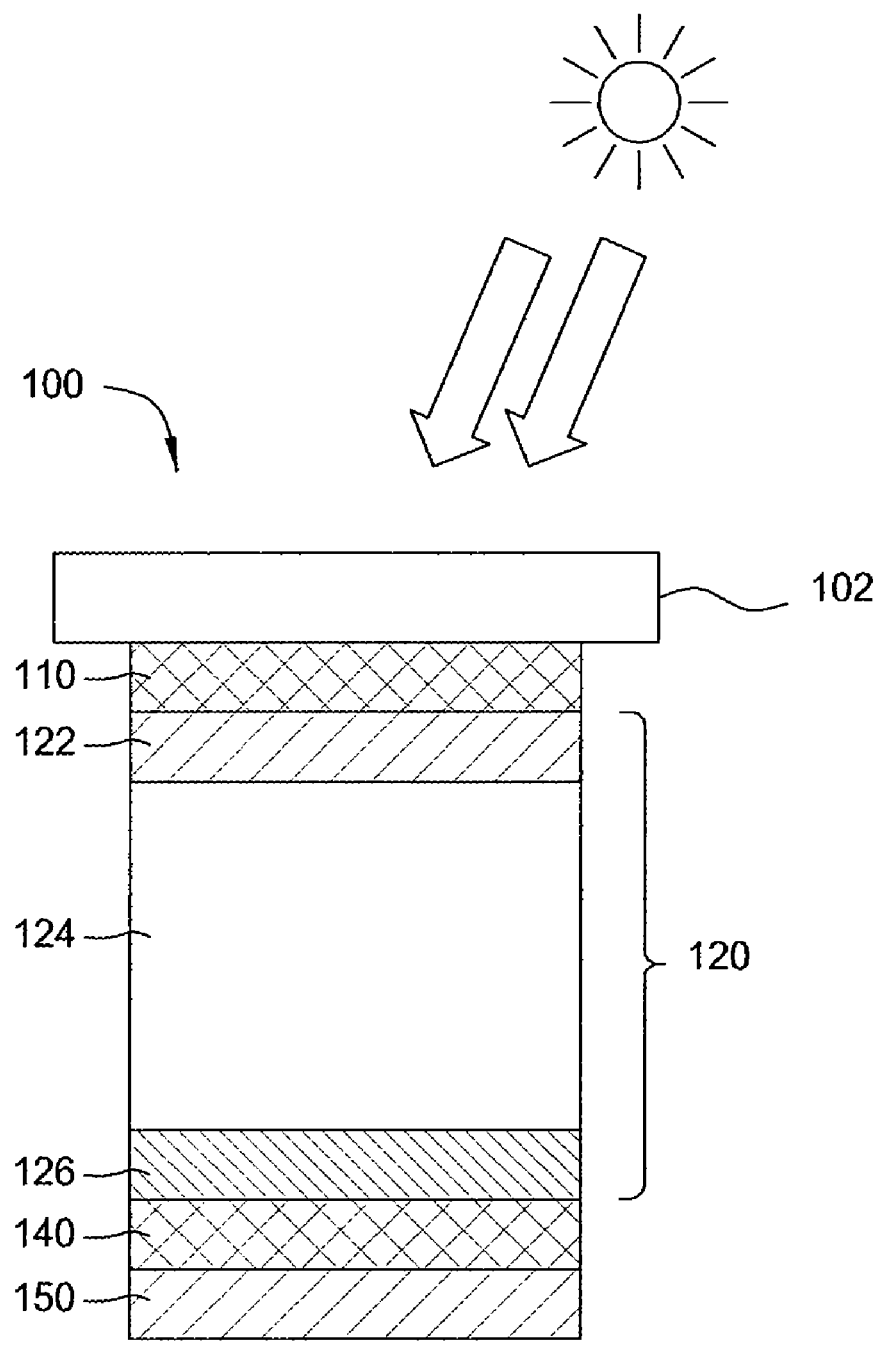
FIG. 1 is a schematic diagram of a microcrystalline silicon based thin film solar cell oriented toward the light or solar radiation.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the invention as recited in the claims relate to thin film multi-junction solar cells and methods and apparatuses for forming the same. Thin film solar cells generally comprise one or more p-i-n junctions. The p-i-n junction generally comprises a p-doped silicon layer or p-type layer and an n-doped silicon layer or n-type layer with an intrinsic layer sandwiched in between the p-type layer and the n-type layer. The intrinsic layer generally comprises an undoped semiconductor layer. In certain embodiments the intrinsic layer comprises a microcrystalline silicon layer which is between about 10,000 Å and 30,000 Å thick. Using current methods, a microcrystalline silicon layer of this size takes about one hour to deposit. However, using the methods in the present disclosure, the deposition time for an intrinsic type microcrystalline silicon layer may be reduced by up to 20-30 minutes without significantly damaging the underlying layers.

Although discussed with reference to specific solar cell structures, it should be understood that the present method for depositing intrinsic type microcrystalline silicon layers maybe used for depositing other structures such as the structures disclosed in U.S. patent application Ser. No. 11/671,988, filed Feb. 6, 2007, entitled MULTI-JUNCTION SOLAR CELLS AND METHODS AND APPARATUSES FOR FORMING THE SAME, to Choi et al., U.S. patent application Ser. No. 11/624,677, filed Jan. 18, 2007, entitled MULTI-JUNCTION SOLAR CELLS AND METHODS AND APPARATUSES FOR FORMING THE SAME, to Choi et al., and U.S. patent application Ser. No. 11/426,127, filed Jun. 23, 2006, entitled METHODS AND APPARATUS FOR DEPOSITING A MICROCRYSTALLINE SILICON FILM FOR PHOTOVOLTAIC DEVICES, to Choi et al., all of which are herein incorporated by reference in their entirety to the extent that they do not conflict with the present disclosure.

FIG. 1 is a schematic diagram of a microcrystalline silicon based thin film solar cell oriented toward the light or solar radiation. The solar cell 100 comprises an intrinsic type microcrystalline silicon layer 124 formed using the methods described herein. Solar cell 100 comprises a substrate 102, such as a glass substrate, polymer substrate, metal substrate, or other suitable substrate with thin films formed thereover. The solar cell 100 further comprises a first transparent conducting oxide (TCO) layer 110 formed over the substrate 102, a p-i-n junction 120 formed over the first TCO layer 110, a second TCO layer 140 formed over the p-i-n junction 120, and a metal back layer 150 formed over the second TCO layer 140. To improve light scattering, the substrate and/or one or more of thin films formed thereover may be optionally textured by wet, plasma, ion, and/or mechanical processes. For example, in the embodiment shown in FIG. 1, the first TCO layer 110 may be textured and the subsequent thin films deposited thereover will generally follow the topography of the surface below it.

The first TCO layer 110 and the second TCO layer 140 may each comprise tin oxide, zinc oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. Zinc oxide preferably comprises 5 atomic % or less of dopants, and more preferably comprises 2.5 atomic % or less aluminum.

The p-i-n junction 120 may comprise a p-type microcrystalline silicon layer 122, an intrinsic type microcrystalline silicon layer 124 formed over the p-type microcrystalline silicon layer 122, and an n-type silicon layer 126 formed over the intrinsic type microcrystalline silicon layer 124. In certain embodiments, the p-type microcrystalline silicon layer 122 may be formed to a thickness between about 100 Å and about 400 Å. In certain embodiments, the intrinsic type microcrystalline silicon layer 124 may be formed to a thickness between about 10,000 Å and about 30,000 Å, for example between about 16,000 Å and about 20,000 Å. In certain embodiments, the n-type silicon layer 126 may be formed to a thickness between about 100 Å and about 500 Å. In certain embodiments, the n-type silicon layer 126 is either an n-type amorphous silicon layer or an n-type microcrystalline silicon layer.

The metal back layer 150 may include, but is not limited to a material selected from the group consisting of Al, Ag, Ti, Cr, Au, Cu, Pt, alloys thereof, or combinations thereof. Other processes may be performed to form the solar cell 100, such a laser scribing processes. Other films, materials, substrates, and/or packaging may be provided over metal back layer 150 to complete the solar cell. The solar cells may be interconnected to form modules, which in turn can be connected to form arrays.

Figure 2:
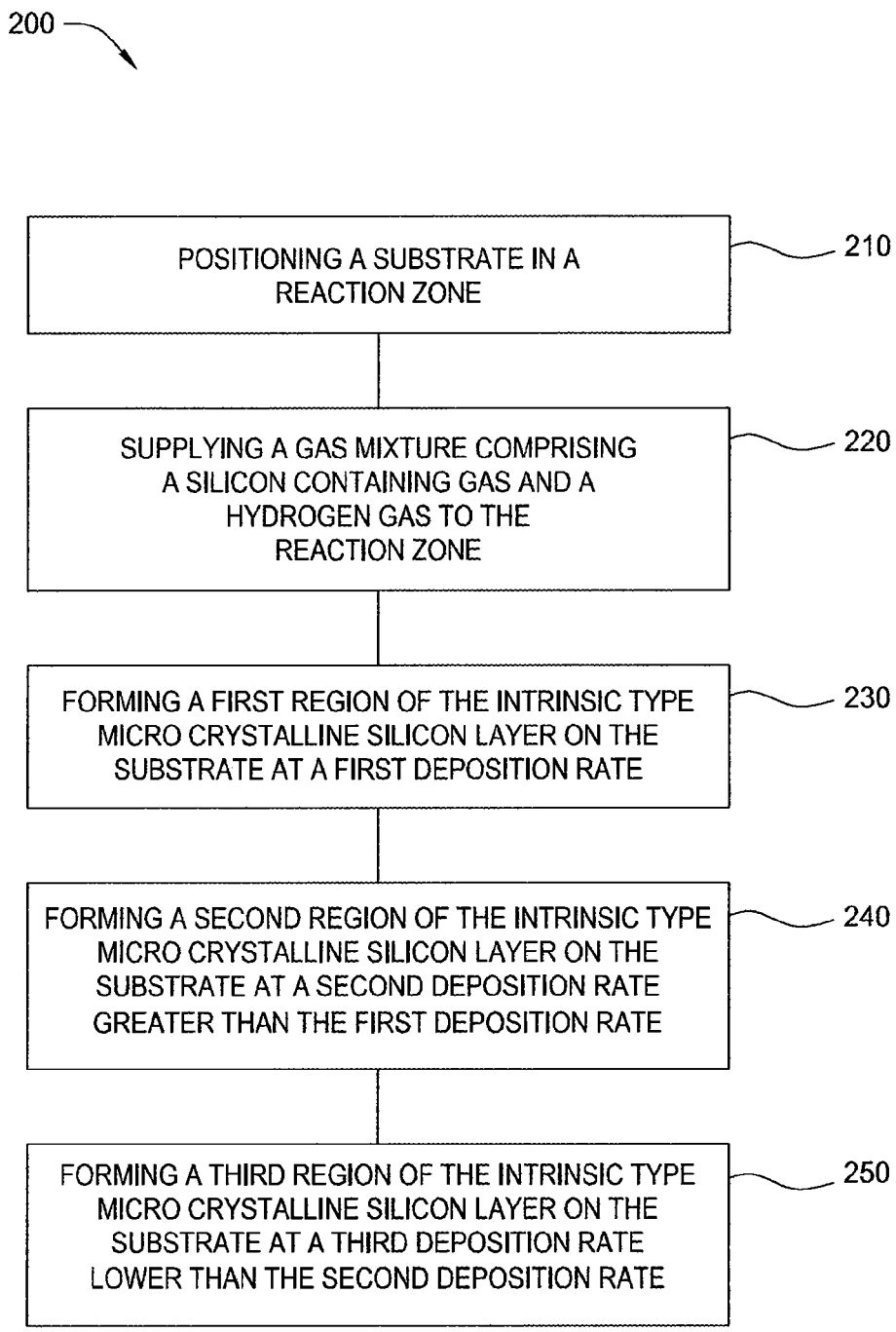
FIG. 2 is a flow chart illustrating the processing steps for forming an intrinsic microcrystalline silicon layer according to one embodiment of the invention.

FIG. 2 is a flow chart 200 illustrating the processing steps according to one embodiment of the invention that may be used to deposit an intrinsic type microcrystalline silicon layer. At step 210, a substrate is positioned in a reaction zone. At step 220, a gas mixture comprising a silicon containing gas and hydrogen gas is supplied to the reaction zone. At step 230, a first region of the intrinsic type microcrystalline silicon layer is formed on the substrate at a first deposition rate. At step 240, a second region of the intrinsic type microcrystalline silicon layer is formed on the substrate at a second deposition rate greater than the first deposition rate. At step 250, a third region of the intrinsic type microcrystalline silicon layer is formed on the substrate at a third deposition rate lower than the second deposition rate.

At step 210, a substrate 102 is positioned in a reaction zone. The substrate may comprise a glass substrate, polymer substrate, metal substrate, or other suitable substrate with thin films formed thereover. In certain instances, the substrate 102 may be provided by the glass manufacturers with the first TCO layer 110 already provided. A p-type microcrystalline silicon layer 122 may also be formed on the substrate 102.

At step 220, a gas mixture comprising a silicon containing gas and hydrogen gas is supplied to the reaction zone. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. In certain embodiments, inert gases such as argon and helium may also be supplied to the reaction zone. In certain embodiments, inert gases such as argon and helium may be supplied to the reaction zone in lieu of helium.

At step 230, a first region of the intrinsic type microcrystalline silicon layer 124 is formed on the substrate 102 at a first deposition rate. The first region of the intrinsic type microcrystalline silicon layer is between about 0 and about 500 Å thick, such as between about 50 Å and about 400 Å thick, for example between about 200 Å and about 300 Å thick. The first region may be deposited at a low deposition rate between about 100 Å/minute and 350 Å/minute, for example, between about 150 Å/minute and about 300 Å/minute. The first region of the intrinsic type microcrystalline silicon layer 124 functions as a buffer layer for the previously deposited p-type microcrystalline silicon layer 122. The first region, which is deposited at a low deposition rate, protects the PI interface during the high RF power deposition which occurs in step 240. It has been found that deposition of the i-type microcrystalline silicon layer directly on the p-type layer using a high deposition rate (e.g. >400 Å/minute) damages the underlying p-type layer. The first region may be formed by providing a silicon containing gas at a flow rate between about 1000 sccm and about 3000 sccm, for example, about 1500 sccm, hydrogen gas at a flow rate between about 100,000 sccm and about 300,000 sccm, for example, about 150,000 sccm, and supplying an RF power between about 0.2 Watts/cm$^2$ and about 0.6 Watts/cm$^2$, for example, about 0.45 Watts/cm$^2$.

At step 240, a second region of the i-type microcrystalline silicon layer is formed on the substrate 102 at a second deposition rate greater than the first deposition rate. The second region of the intrinsic type microcrystalline silicon layer is between about 10,000 Å and about 30,000 Å thick, preferably between about 16,000 and about 20,000 Å thick. The second region may be deposited at a deposition rate greater than about 400 Å/minute, for example, between about 400 Å/minute and about 1500 Å/minute or between about 500 Å/minute and about 600 Å/minute. The presence of the first region which functions as a buffer layer allows for the second region to be deposited using a higher RF power and a higher deposition rate. The second region may be formed by providing a silicon containing gas at a flow rate between about 1,000 sccm and about 6,000 sccm, for example, about 3,000 sccm, hydrogen gas at a flow rate between about 200,000 sccm and about 600,000 sccm, for example, about 300,000 sccm, and RF power between 0.6 Watts/cm$^2$ and about 1.3 Watts/cm$^2$, for example, about 0.9 Watts/cm$^2$.

At step 250, a third region of the intrinsic type microcrystalline silicon layer 124 is formed on the substrate at a third deposition rate lower than the second deposition rate. The third region of the intrinsic type microcrystalline silicon layer 124 is between about 0 and about 500 Å thick, such as between about 50 Å and about 400 Å thick, for example between about 200 Å and about 300 Å thick. The third region may be deposited at a deposition rate between about 100 Å/minute and 350 Å/minute, for example, between about 150 Å/minute and about 300 Å/minute. The third region functions as a passivation layer for the previously deposited second region of the intrinsic type microcrystalline silicon layer 124. The second region which is deposited at a high deposition rate is composed of large microcrystalline silicon crystals which form an uneven surface. Deposition of the n-type silicon layer 126 directly onto the uneven surface of the second region would yield an uneven n-type silicon layer 126 thus making uniform deposition of subsequent layers very difficult. Thus deposition of the third region of the intrinsic type microcrystalline silicon layer at a low deposition rate yields an intrinsic type microcrystalline layer with a more even surface making uniform deposition of subsequent layers possible. The third region may be formed by providing silane gas at a flow rate between about 1,000 sccm and about 3,000 sccm, for example about 1,500 sccm, hydrogen gas at a flow rate between about 100,000 sccm and about 300,000 sccm, for example about 150,000 sccm, and RF power between 0.2 Watts/cm$^2$ and about 0.6 Watts/cm$^2$, for example about 0.45 Watts/cm$^2$. One embodiment of the intrinsic microcrystalline silicon layer has the following properties set forth in FIG. 8.

Figure 3:
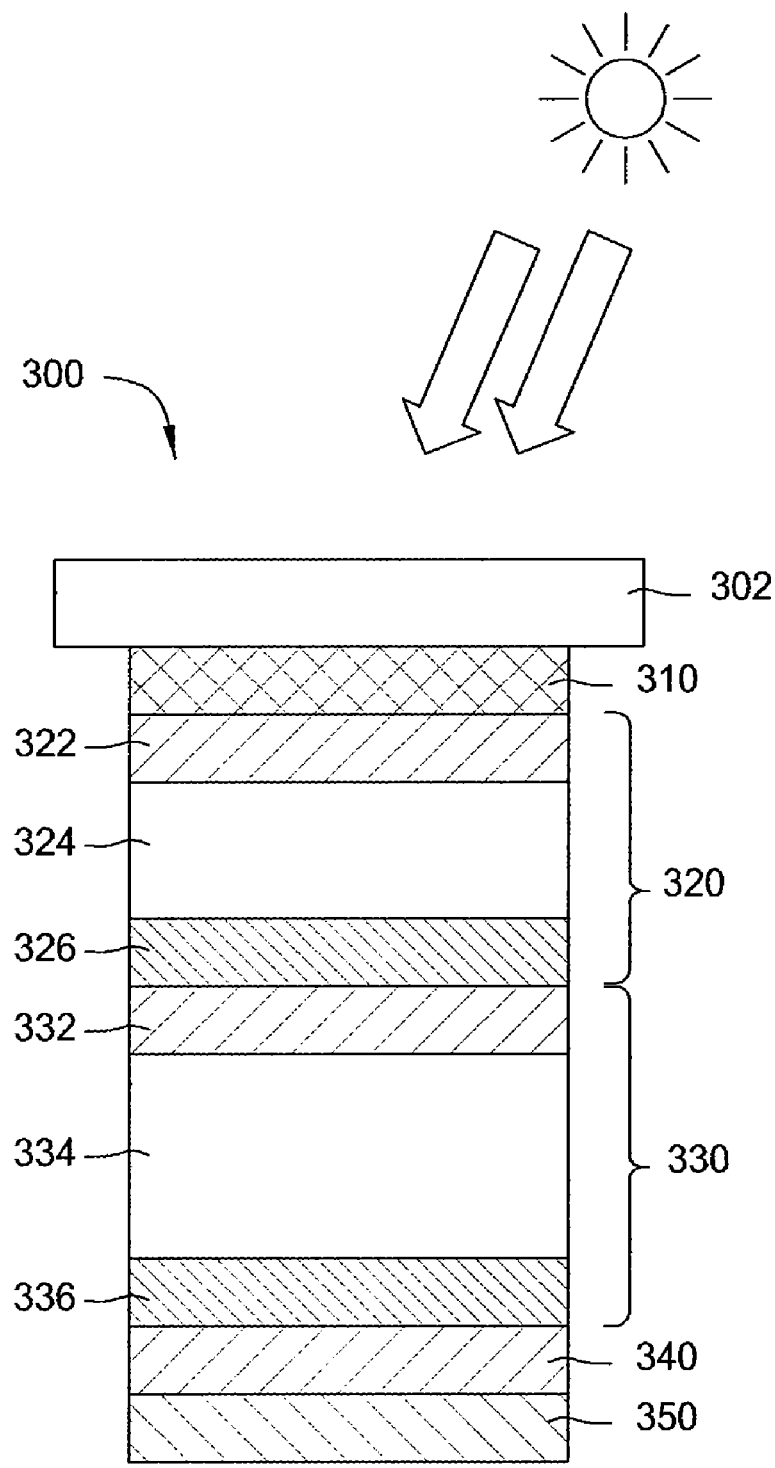
FIG. 3 is a schematic diagram of a multi-junction solar cell oriented toward the light or solar radiation.

FIG. 3 is a schematic diagram of a multi-junction solar cell oriented toward the light or solar radiation. The solar cell 300 comprises an intrinsic type microcrystalline silicon layer (i-type μc-Si layer) 334 formed using the methods described herein. Solar cell 300 comprises a substrate 302, such as a glass substrate, polymer substrate, metal substrate, or other suitable substrate with thin films formed thereover. The solar cell 300 further comprises a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a metal back layer 350 formed over the second TCO layer 340. To improve light scattering by reducing light reflection, the substrate and/or one or more of thin films formed thereover may be optionally textured by wet, plasma, ion, and/or mechanical processes.

The first TCO layer 310 and the second TCO layer 340 may each comprise tin oxide, zinc oxide, indium tin oxide, cadmium stannate, combinations thereof, or other suitable materials. It is understood that the TCO materials may also include additional dopants and components. For example, zinc oxide may further include dopants, such as aluminum, gallium, boron, and other suitable dopants. Zinc oxide preferably comprises 5 atomic % or less of dopants, and more preferably comprises 2.5 atomic % or less aluminum. In certain instances, the substrate 302 may be provided by the glass manufacturers with the first TCO layer 310 already provided.

The first p-i-n junction 320 may comprise a p-type amorphous silicon layer 322, an intrinsic type amorphous silicon layer 324 formed over the p-type amorphous silicon layer 322, and a first n-type silicon layer 326 formed over the intrinsic type amorphous silicon layer 324. In certain embodiments, the p-type amorphous silicon layer 322 may be formed to a thickness between about 60 Å and about 300 Å. In certain embodiments, the intrinsic type amorphous silicon layer 324 may be formed to a thickness between about 1,500 Å and about 3,500 Å. In certain embodiments, the first n-type silicon layer 326 may be formed to a thickness between about 100 Å and about 400 Å. In certain embodiments, the first n-type silicon layer 326 is a dual layer structure comprising n-type amorphous silicon and n-type microcrystalline silicon with the n-type amorphous silicon deposited on the intrinsic type amorphous silicon layer 324. In certain embodiments, the first n-type silicon layer 326 comprises microcrystalline silicon.

The second p-i-n junction 330 may comprise a p-type microcrystalline silicon layer 332, an intrinsic type microcrystalline silicon layer 334 formed over the p-type microcrystalline silicon layer 332, and a second n-type silicon layer 336 formed over the intrinsic type microcrystalline silicon layer 334, wherein the second n-type silicon layer is either microcrystalline silicon or amorphous silicon. In certain embodiments, the p-type microcrystalline silicon layer 332 may be formed to a thickness between about 100 Å and about 400 Å. In certain embodiments, the intrinsic type microcrystalline silicon layer 334 may be formed using the methods described herein to a thickness between about 10,000 Å and about 30,000 Å, for example, between about 16,000 Å and about 20,000 Å. In certain embodiments, the second n-type silicon layer 336 may be formed to a thickness between about 100 Å and about 500 Å. In certain embodiments, the second n-type silicon layer 336 is an amorphous silicon layer. In certain embodiments, the second n-type silicon layer 336 is a microcrystalline silicon layer.

The metal back layer 350 may include, but is not limited to a material selected from the group consisting of Al, Ag, Ti, Cr, Au, Cu, Pt, alloys thereof, or combinations thereof. Other processes may be performed to form the solar cell 300, such as a laser scribing processes. Other films, materials, substrates, and/or packaging may be provided over metal back layer 350 to complete the solar cell. The solar cells may be interconnected to form modules, which in turn can be connected to form arrays.

Solar radiation is absorbed by the intrinsic layers of the p-i-n junctions 320, 330 and is converted to electron-holes pairs. The electric field created between the p-type layer and the n-type layer that stretches across the intrinsic layer causes electrons to flow toward the n-type layers and holes to flow toward the p-type layers creating current. The first p-i-n junction 320 comprises an intrinsic type amorphous silicon layer 324 and the second p-i-n junction 330 comprises an intrinsic type microcrystalline silicon layer 334 because amorphous silicon and microcrystalline silicon absorb different wavelengths of solar radiation. Therefore, the solar cell 300 is more efficient since it captures a larger portion of the solar radiation spectrum. The intrinsic layer of amorphous silicon and the intrinsic layer of microcrystalline are stacked in such a way that solar radiation first strikes the intrinsic type amorphous silicon layer 324 and then strikes the intrinsic type microcrystalline silicon layer 334 since amorphous silicon has a larger bandgap than microcrystalline silicon. Solar radiation not absorbed by the first p-i-n junction 320 continues on to the second p-i-n junction 330.

In one aspect, the solar cell 300 does not need to utilize a metal tunnel layer between the first p-i-n junction 320 and the second p-i-n junction 330. The first n-type silicon layer 326 of the first p-i-n junction 320 and the p-type microcrystalline silicon layer 332 has sufficient conductivity to provide a tunnel junction to allow electrons to flow from the first p-i-n junction 320 to the second p-i-n junction 330.

Figure 4:
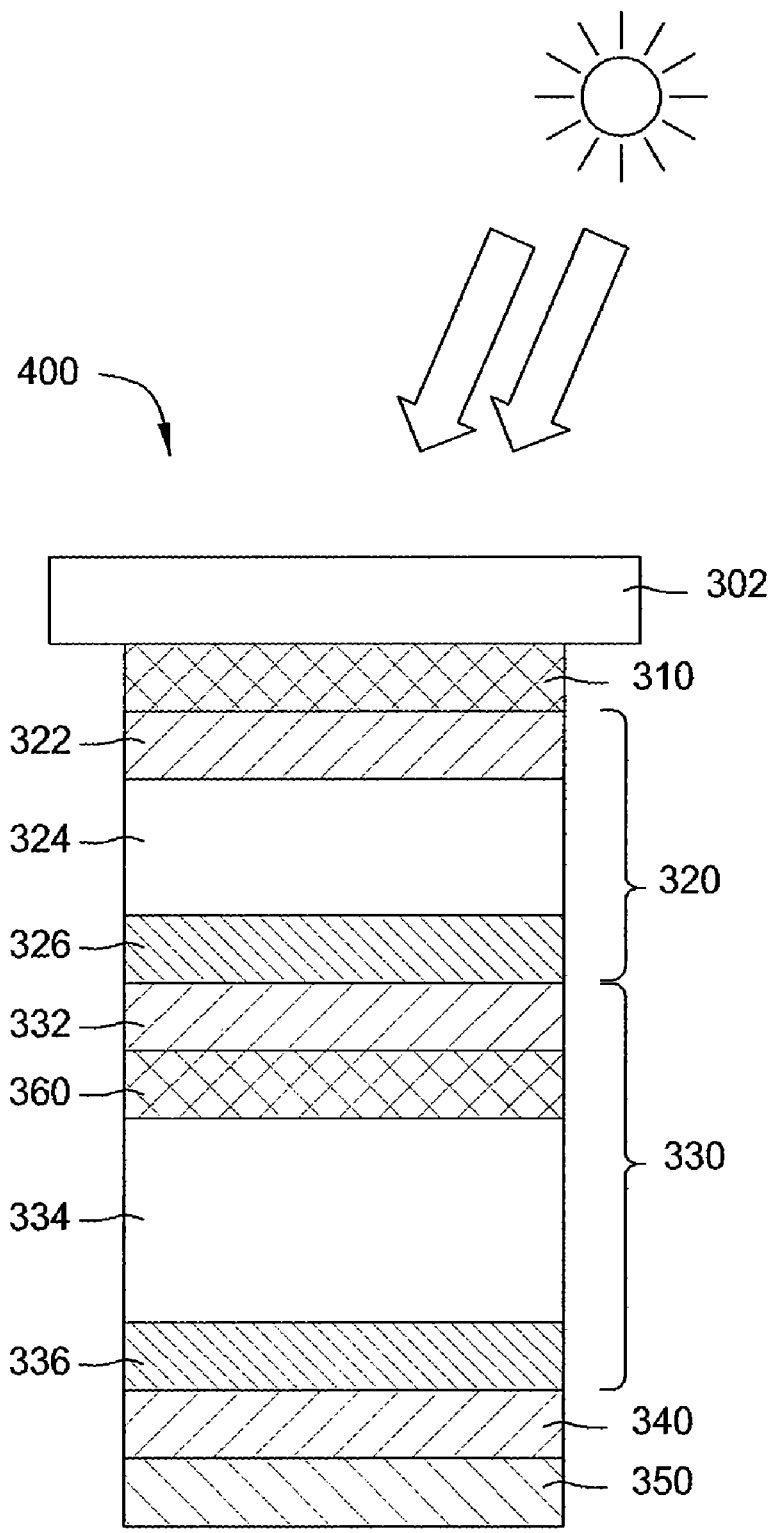
FIG. 4 is a schematic diagram of the multi-junction solar cell of FIG. 3 further comprising a seed layer.

FIG. 4 is a schematic diagram of the multi-junction solar cell of FIG. 3 further comprising a seed layer 360 formed between the p-type microcrystalline silicon layer 332 and the intrinsic type microcrystalline silicon layer 334. In certain embodiments the seed layer 360 may be formed to a thickness between about 20 Å and about 500 Å, such as between about 50 Å and about 300 Å, for example, between about 100 Å and about 200 Å. It is believed that the seed layer 360 helps provide better contact adhesion and interfacial qualities between the p-type microcrystalline layer and the intrinsic type microcrystalline silicon layer 334. The low deposition rate of the seed layer may be controlled by a gas mixture having a ratio of silane-based gas to H2 between about 1:100 and about 1:20,000, such as between 1:200 and 1:1,500, for example 1:1,000 with other process parameters substantially similar to the i-type μc-Si layer 334 deposition. In another embodiment, the i-type μc-Si layer 334 deposition may include a four step deposition process having a first step depositing the seed layer and a second, third, and fourth step as described herein for depositing the bulk i-type μc-Si layer 334. The first step seed layer deposition process has a relatively lower deposition rate, such as less than 100 Å/minute, controlled by a gas mixture having a ratio of silane-based gas to $H_2$ between about 1:100 and about 1:2,000, such as between 1:200 and 1:1,500, for example 1:1,000.

Figure 5:
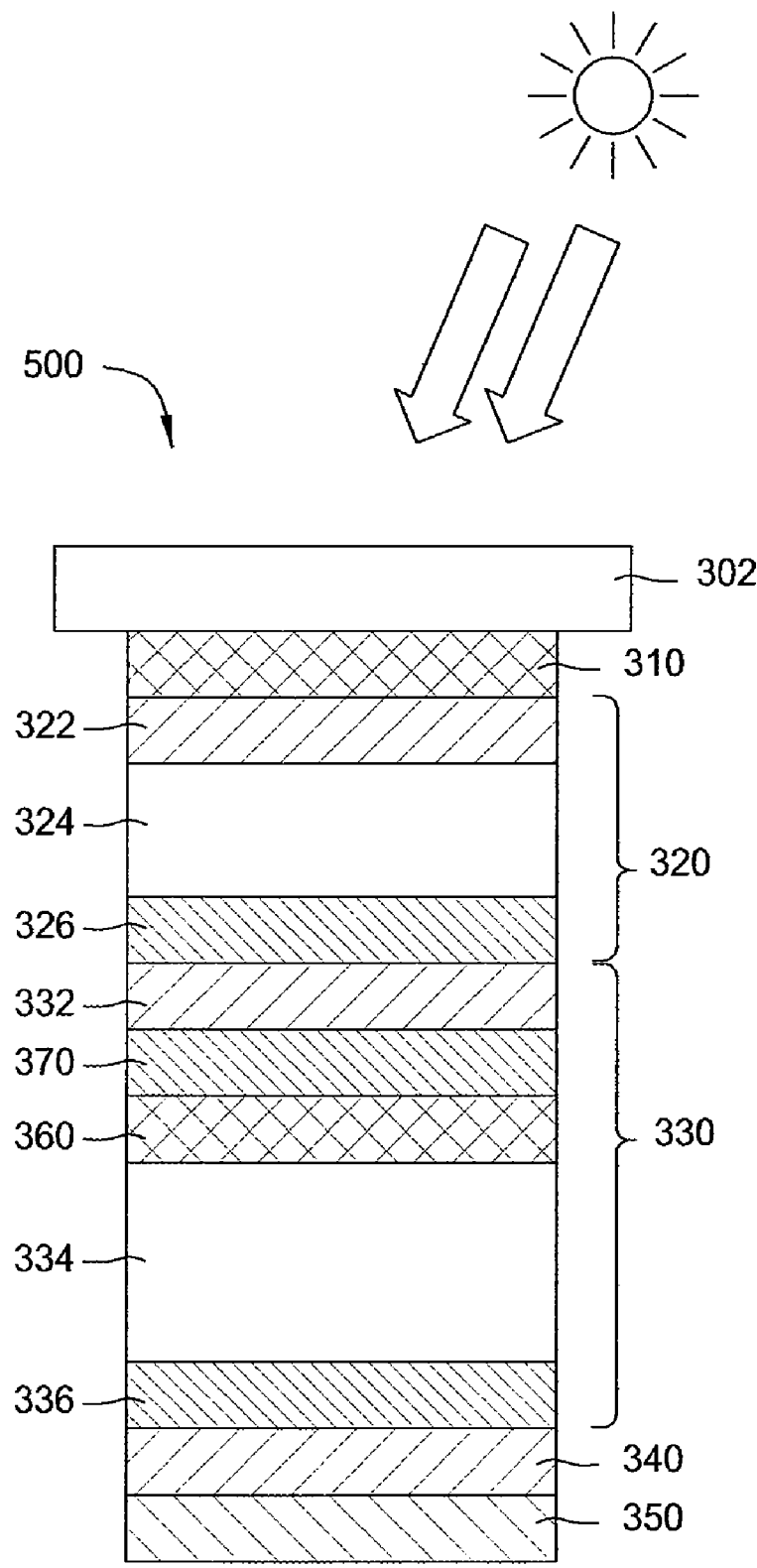
FIG. 5 is a schematic diagram of the multi-junction solar cell of FIG. 3 further comprising a seed layer and an amorphous silicon barrier layer.

FIG. 5 is a schematic diagram of the multi-junction solar cell of FIG. 3 further comprising an amorphous silicon barrier layer 370 formed between the p-type microcrystalline silicon layer 332 and the seed layer 360. In certain embodiments the amorphous silicon barrier layer 370 may be formed to a thickness between about 20 Å and about 100 Å, such as between about 30 Å and about 90 Å. It is believed that the amorphous silicon barrier layer 370 acts as a dopant diffusion barrier layer thus preventing contamination of the intrinsic type microcrystalline silicon layer 334 with dopants such as boron. Although depicted with the seed layer 360, it should be understood that the amorphous silicon barrier layer 370 may be used in structures without the seed layer 360.

Figure 6:
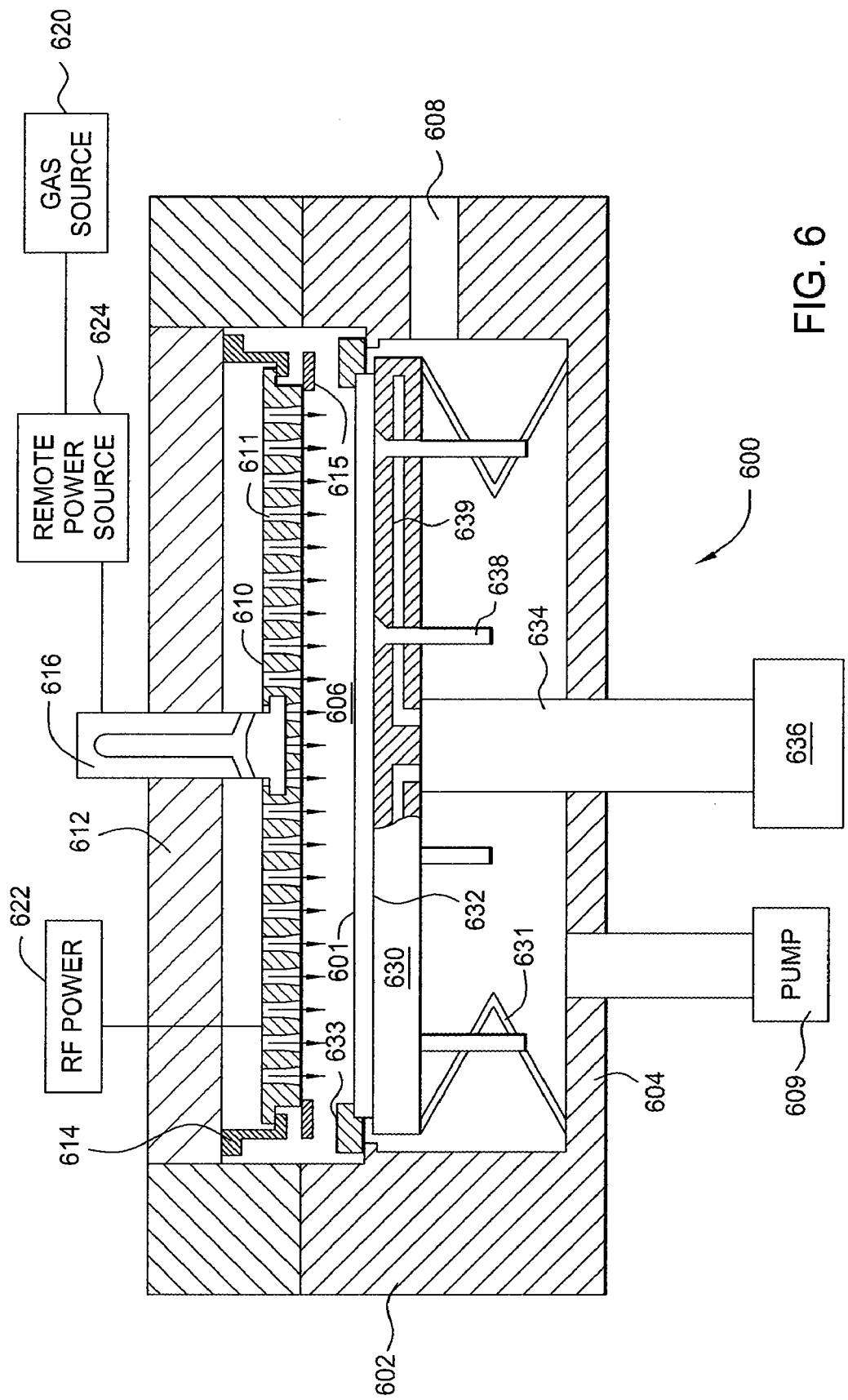
FIG. 6 is a schematic cross-section view of one embodiment of a plasma enhanced chemical vapor deposition (PECVD) chamber in which one or more solar films of a solar cell may be deposited.

FIG. 6 is a schematic cross-section view of one embodiment of a plasma enhanced chemical vapor deposition (PECVD) chamber in which one or more solar films of a solar cell, such as the solar cell 100 of FIG. 1 and solar cell 300 of FIG. 3, FIG. 4, and FIG. 5, may be deposited. Suitable plasma enhanced chemical vapor deposition chambers include the AKT 4300 PECVD and the AKT 60K both of which are available from AKT America, Inc., of Santa Clara, Calif.

It is contemplated that other deposition chambers, including those from other manufacturers, may be utilized to practice the present invention.

The chamber 600 generally includes walls 602, a bottom 604, and a showerhead 610, and substrate support 630 which define a reaction zone 606. The reaction zone 606 is accessed through a valve 608 such that the substrate, such as substrate 601, may be transferred in and out of the chamber 600. The substrate support 630 includes a substrate receiving surface 632 for supporting a substrate and stem 634 coupled to a lift system 636 to raise and lower the substrate support 630. A shadow from 633 may be optionally placed over periphery of the substrate 601. Lift pins 638 are moveably disposed through the substrate support 630 to move a substrate to and from the substrate receiving surface 632. The substrate support 630 may also include heating and/or cooling elements 639 to maintain the substrate support 630 at a desired temperature. The substrate support 630 may also include grounding straps 631 to provide RF grounding at the periphery of the substrate support 630. Examples of grounding straps are disclosed in U.S. Pat. No. 6,024,044 issued on Feb. 15, 2000 to Law et al. and U.S. patent application Ser. No. 11/613,934 filed on Dec. 20, 2006 to Park et al., which are both incorporated by reference in their entirety to the extent not inconsistent with the present disclosure.

The showerhead 610 is coupled to a backing plate 612 at its periphery by a suspension 614. The showerhead 610 may also be coupled to the backing plate by one or more center supports 616 to help prevent sag and/or control the straightness/curvature of the showerhead 610. A gas source 620 is coupled to the backing plate 612 to provide gas through the backing plate 612 and through the showerhead 610 to the substrate receiving surface 632. A vacuum pump 609 is coupled to the chamber 600 to control the reaction zone 606 at a desired pressure. An RF power source 622 is coupled to the backing plate 612 and/or to the showerhead 610 to provide a RF power to the showerhead 610 so that an electric field is created between the showerhead and the substrate support so that a plasma may be generated from the gases between the showerhead 610 and the substrate support 630. Various RF frequencies may be used, such as a frequency between about 0.3 MHz and about 200 MHz. In one embodiment the RF power source is provided at a frequency of 13.56 MHz. Examples of showerheads are disclosed in U.S. Pat. No. 6,477,980 issued on Nov. 12, 2002 to White et al., U.S. Publication 2005/0251990 published on Nov. 17, 2006 to Choi et al., and U.S. Publication 2006/0060138 published on Mar. 23, 2006 to Keller et al., which are all incorporated by reference in their entirety to the extent not inconsistent with the present disclosure.

A remote plasma source 624, such as an inductively coupled remote plasma source, may also be coupled between the gas source and the backing plate. During intervals between processing of substrates, a cleaning gas may be provided to the remote plasma source 624 so that a remote plasma is generated and provided to clean chamber components. The cleaning gas may be further excited by the RF power source 622 provided to the showerhead. Suitable cleaning gases include but are not limited to $NF_3$, $F_2$, and $SF_6$. Examples of remote plasma sources are disclosed in U.S. Pat. No. 5,788,778 issued Aug. 4, 1998 to Shang et al., which is incorporated by reference to the extent not inconsistent with the present disclosure.

The deposition methods for one or more silicon layers, such as one or more of the silicon layers of the solar cell 100 of FIG. 1 and solar cell 300 of FIG. 3, FIG. 4, and FIG. 5, may include the following deposition parameters in the process chamber of FIG. 6 or other suitable chamber. A substrate having a surface area of 10,000 cm$^2$ or more, preferably 40,000 cm$^2$ or more, and more preferably 55,000 cm$^2$ or more is provided to the chamber. It is understood that after processing the substrate may be cut to form smaller solar cells.

In one embodiment, the heating and/or cooling elements 639 may be set to provide a substrate support temperature during deposition of about 400° C. or less, preferably between about 100° C. and about 400° C., more preferably between about 150° C. and about 300° C., such as about 200° C.

The spacing during deposition between the top surface of a substrate disposed on the substrate receiving surface 632 and the showerhead 610 may be between 400 mil and about 1,200 mil, preferably between 400 mil and about 800 mil.

For deposition of silicon films, a silicon-based gas and hydrogen gas ($H_2$) are provided. Suitable silicon based gases include, but are not limited to silane ($SiH_4$), disilane ($Si_2H_6$), silicon tetrafluoride ($SiF_4$), silicon tetrachloride ($SiCl_4$), dichlorosilane ($SiH_2Cl_2$), and combinations thereof. The p-type dopants of the p-type silicon layers may each comprise a group III element, such as boron or aluminum. Preferably, boron is used as the p-type dopant. Examples of boron-containing sources include trimethylboron (TMB (or $B(CH_3)_3$)), diborane ($B_2H_6$), $BF_3$, $B(C_2H_5)_3$, and similar compounds. Preferably, TMB is used as the p-type dopant. The n-type dopants of the n-type silicon layer may each comprise a group V element, such as phosphorus, arsenic, or antimony. Preferably, phosphorus is used as the n-type dopant. Examples of phosphorus-containing sources include phosphine and similar compounds. The dopants are typically provided with a carrier gas, such as hydrogen, argon, helium, and other suitable compounds. In the process regimes disclosed herein, a total flow rate of hydrogen gas is provided. Therefore, if hydrogen gas is provided as the carrier gas, such as for the dopant, the carrier gas flow rate should be subtracted from the total flow rate of hydrogen to determine how much additional hydrogen gas should be provided to the chamber.

Certain embodiments of depositing a p-type amorphous silicon layer, such as the silicon layer 322 of FIGS. 3-5, may comprise providing a gas mixture of hydrogen gas to silicon containing gas in a ratio of about 20:1 or less. Silane gas may be provided at a flow rate between about 10 sccm/L and about 200 sccm/L. Hydrogen gas may be provided at a flow rate between about 100 sccm/L and 1000 sccm/L. Trimethylboron may be provided at a flow rate between about 0.5 sccm/L and about 1 sccm/L. In other words, if trimethylboron is provided in a 0.5% molar or volume concentration in a carrier gas, then the dopant/carrier gas mixture may be provided at a flow rate between about 100 sccm/L and about 200 sccm/L. Methane may be provided at a flow rate between about 100 sccm/L and 200 sccm/L. The flow rates in the present disclosure are expressed as sccm per interior chamber volume. The interior chamber volume is defined as the volume of the interior of the chamber in which a gas can occupy. For example, the interior chamber volume of chamber 600 is the volume defined by the backing plate 612 and by the walls 602 and bottom 604 of the chamber minus the volume occupied therein by the showerhead assembly (i.e., including the showerhead 610, suspension 614, center support 615) and by the substrate support assembly (i.e., substrate support 630, grounding straps 631). An RF power between about 15 milliWatts/$cm^2$ and about 200 milliWatts/$cm^2$ may be provided to the showerhead. The RF powers in the present disclosure are expressed as Watts supplied to an electrode per substrate area. For example, for a RF power of 10,385 Watts supplied to a showerhead to process a substrate having dimensions of 220 cm×260 cm, the RF power would be 10,385 Watts/(220 cm×260 cm)=180 milliWatts/$cm^2$. The pressure of the chamber is maintained between about 0.1 Torr and 20 Torr, preferably between about 1 Torr and about 4 Torr. The deposition rate of the p-type amorphous silicon layer may be about 100 Å/min or more. Methane or other carbon containing compounds, such $C_3H_8$, $C_4H_{10}$, $C_2H_2$, can be used to improve the window properties (e.g. to lower absorption of solar radiation) of p-type amorphous silicon layer. Thus, an increased amount of solar radiation may be absorbed through the intrinsic layers and thus cell efficiency is improved.

Certain embodiments of depositing an intrinsic type amorphous silicon layer, such as the silicon layer 324 of FIGS. 3-5, comprises providing a gas mixture of hydrogen gas to silicon containing gas in a ratio of about 20:1 or less. Silane gas may be provided at a flow rate between about 100 sccm/L and about 200 sccm/L. Hydrogen gas may be provided at a flow rate between about 100 sccm/L and 3000 sccm/L. An RF power between 15 milliWatts/$cm^2$ and about 250 milliWatts/$cm^2$ may be provided to the showerhead. The pressure of the chamber may be maintained between about 0.1 Torr and 20 Torr, preferably between about 0.5 Torr and about 5 Torr. The deposition rate of the intrinsic type amorphous silicon layer may be about 100 Å/min or more.

Certain embodiments of depositing an n-type silicon layer, such as the first n-type silicon layer 326 of FIGS. 3-5, comprise providing hydrogen gas to silicon gas in a ratio of about 1000:1 or less. Silane gas may be provided at a flow rate between about 1 sccm/L and about 250 sccm/L. Hydrogen gas may be provided at a flow rate between about 100 sccm/L and about 5000 sccm/L. Phosphine may be provided at a flow rate between about 0.005 sccm/L and about 0.15 sccm/L. In other words, if phosphine is provided in a 0.5% molar or volume concentration in a carrier gas, then the dopant/carrier gas mixture may be provided at a flow rate between about 1 sccm/L and about 30 sccm/L. An RF power between about 15 milliWatts/$cm^2$ and about 1000 milliWatts/$cm^2$ may be provided to the showerhead. The pressure of the chamber may be maintained between about 0.1 Torr and 20 Torr, preferably between about 0.5 Torr and about 12 Torr. The deposition rate of the first n-type silicon layer 326 may be about 200 Å/min or more.

Certain embodiments of depositing a p-type microcrystalline silicon layer, such as layer 332 of FIGS. 3-5 or layer 122 of FIG. 1, may comprise providing a gas mixture of hydrogen gas to silicon containing gas in ratio of about 200:1 or greater. Silane gas may be provided at a flow rate between about 1 sccm/L and about 20 sccm/L. Hydrogen gas may be provided at a flow rate between about 100 sccm/L and about 6,000 sccm/L. Trimethylboron may be provided at a flow rate between about 0.005 sccm/L and about 0.05 sccm/L. In other words, if trimethylboron is provided in a 0.5% molar or volume concentration in a carrier gas, then the dopant/carrier gas mixture may be provided at a flow rate between about 1 sccm/L and about 10 sccm/L. An RF power between about 50 milliWatts/$cm^2$ and about 1000 milliWatts/$cm^2$ may be provided to the showerhead. The pressure of the chamber may be maintained between about 1 Torr and about 100 Torr, preferably between about 3 Torr and about 20 Torr, more preferably between 4 Torr and about 12 Torr. The deposition rate of the p-type microcrystalline silicon contact layer may be about 10 Å/min or more. The p-type microcrystalline silicon contact layer has a crystalline fraction between about 20 percent and about 80 percent, preferably between 50 percent and about 70 percent.

Certain embodiments of depositing an intrinsic type microcrystalline silicon layer, such as silicon layer 334 of FIGS. 3-5, may be deposited as described above in relation to the intrinsic type microcrystalline silicon layer 124.

Certain embodiments of depositing an n-type amorphous or microcrystalline silicon layer, such as the second n-type silicon layer 336 of FIGS. 3-5, may comprise providing a gas mixture of hydrogen gas to silicon containing gas in a ratio of about 5:1 or more. Silane gas may be provided at a flow rate between about 100 sccm/L and about 300 sccm/L. Hydrogen gas may be provided at a flow rate between about 100 sccm/L and about 2,000 sccm/L. Phosphine may be provided at a flow rate between about 0.05 sccm/L and about 1.5 sccm/L. In other words, if phosphine is provided in a 0.5% molar or volume concentration in a carrier gas, then the dopant/carrier gas may be provided at a flow rate between about 10 sccm/L and about 300 sccm/L. An RF power between about 100 milliWatts/cm$^2$ and about 900 milliWatts/cm$^2$ may be provided to the showerhead. The pressure of the chamber may be maintained between about 1 Torr and about 100 Torr, preferably between about 3 Torr and about 20 Torr, more preferably between 3 Torr and about 12 Torr. The deposition rate of the n-type microcrystalline or amorphous silicon layer may be about 50 Å/min or more. In certain embodiments the n-type microcrystalline silicon layer has a crystalline fraction between about 20 percent and about 80 percent, preferably between 50 percent and about 70 percent.

Figure 7:
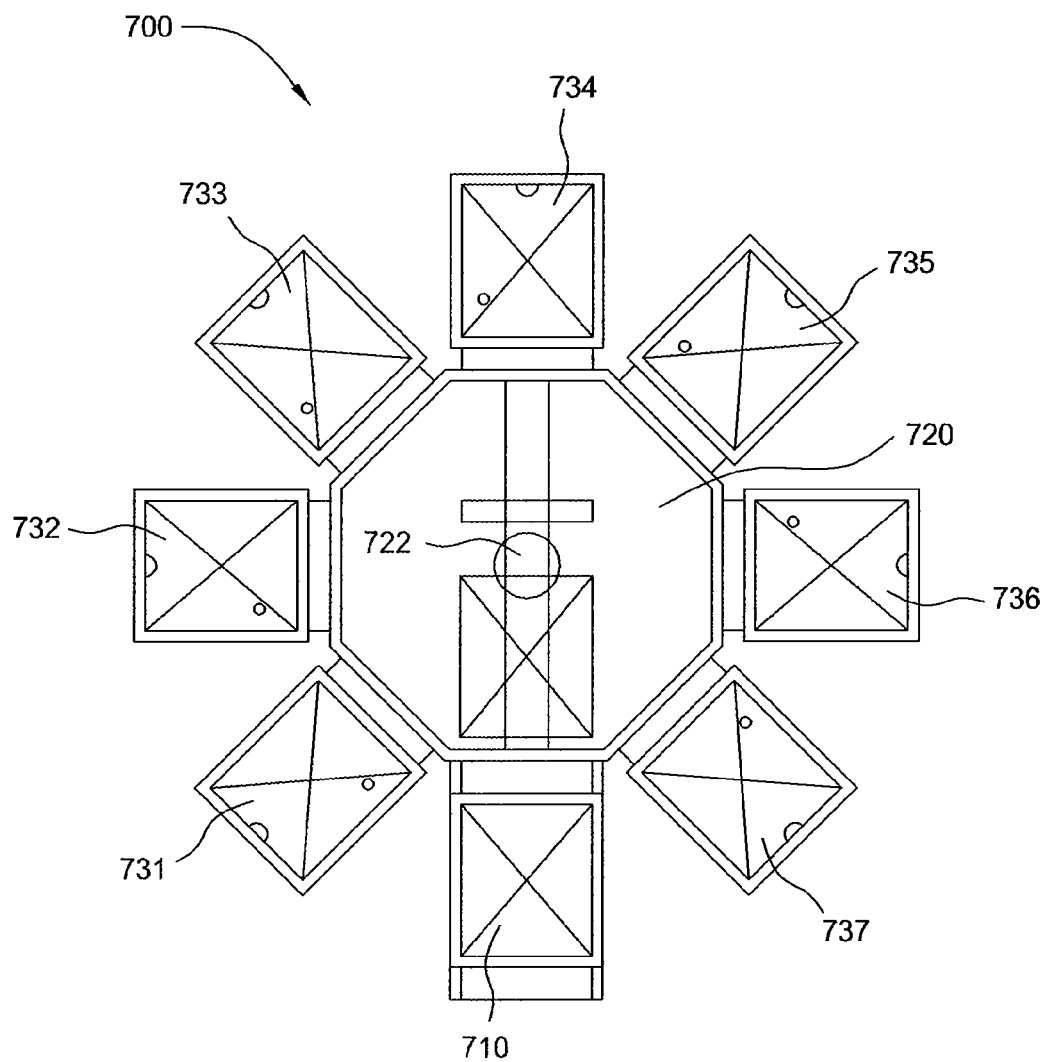
FIG. 7 is a top schematic view of one embodiment of a process system having a plurality of process chambers.

FIG. 7 is a top schematic view of one embodiment of a process system 700 having a plurality of process chambers 731-737, such as PECVD chambers chamber 600 of FIG. 6 or other suitable chambers capable of depositing silicon films. The process system 700 includes a transfer chamber 720 coupled to a load lock chamber 710 and the process chambers 731-737. The load lock chamber 710 allows substrates to be transferred between the ambient environment outside the system and vacuum environment within the transfer chamber 720 and process chambers 731-737. The load lock chamber 710 includes one or more evacuatable regions holding one or more substrate. The evacuatable regions are pumped down during input of substrates into the system 700 and are vented during output of the substrates from the system 700. The transfer chamber 720 has at least one vacuum robot 722 disposed therein that is adapted to transfer substrates between the load lock chamber 710 and the process chambers 731-737. Seven process chambers are shown in FIG. 7; however, the system may have any suitable number of process chambers.

In certain embodiments of the invention, one system 700 is configured to deposit the first p-i-n junction comprising an intrinsic type amorphous silicon layer(s) of a multi-junction solar cell, such as the first p-i-n junction 320 of FIGS. 3-5. One of the process chambers 731-737 is configured to deposit the p-type silicon layer(s) of the first p-i-n junction while the remaining process chambers 731-737 are each configured to deposit both the intrinsic type amorphous silicon layer(s) and the n-type silicon layer(s). The intrinsic type amorphous silicon layer(s) and the n-type silicon layer(s) of the first p-i-n junction may be deposited in the same chamber without any passivation process in between the deposition steps. Thus, a substrate enters the system through the load lock chamber 710, is transferred by the vacuum robot into the dedicated process chamber configured to deposit the p-type silicon layer(s), is transferred by the vacuum robot into one of the remaining process chamber configured to deposited both the intrinsic type silicon layer(s) and the n-type silicon layer(s), and is transferred by the vacuum robot back to the load lock chamber 710. In certain embodiments, the time to process a substrate with the process chamber to form the p-type silicon layer(s) is approximately 4 or more times faster, preferably 15 or more times faster, than the time to form the intrinsic type amorphous silicon layer(s) and the n-type silicon layer(s) in a single chamber. Therefore, in certain embodiments of the system to deposit the first p-i-n junction, the ratio of p-chambers to i/n-chambers is 1:4 or more, preferably 1:6 or more. The throughput of the system including the time to provide plasma cleaning of the process chambers may be about 20 substrates/hr or more.

In certain embodiments of the invention, one system 700 is configured to deposit the second p-i-n junction comprising an intrinsic type microcrystalline silicon layer(s) of a multi-junction solar cell, such as the second p-i-n junction 330 of FIGS. 3-5. One of the process chambers 731-737 is configured to deposit the p-type silicon layer(s) of the first p-i-n junction while the remaining process chambers 731-737 are each configured to deposit both the intrinsic type microcrystalline silicon layer(s) and the n-type silicon layer(s). The intrinsic type microcrystalline silicon layer(s) and the n-type silicon layer(s) of the second p-i-n junction may be deposited in the same chamber without any passivation process in between the deposition steps.

Thus improved methods for depositing a microcrystalline silicon films are provided. The method advantageously increases the deposition rate of the microcrystalline silicon layer in a solar cell without significantly damaging the underlying layers. The increased deposition rate reduces the processing time for solar cells comprising microcrystalline silicon layers and increases manufacturing throughput while reducing production costs.

While the foregoing is directed to embodiments of the present invention, other and further embodiments of the invention may be devised without departing from the basic scope thereof, and the scope thereof is determined by the claims that follow. For example, the process chamber of FIG. 4 has been shown in a horizontal position. It is understood that in other embodiments of the invention the process chamber may be in any non-horizontal position, such as vertical. For example, embodiments of the invention have been described in reference to the multi-process chamber cluster tool in FIG. 7. It is understood that embodiments of the invention may also be practiced in on in-line systems and hybrid in-line/cluster systems. For example, embodiments of the invention have been described in reference to a first system configured to form a first p-i-n junction and a second p-i-n junction. It is understood that in other embodiments of the invention, the first p-i-n junction and a second p-i-n junction may be formed in a single system. For example, embodiments of the invention have been described in reference to a process chamber adapted to deposit both an intrinsic type layer and an n-type layer. It is understood that in other embodiments of the invention, separate chambers may be adapted to deposit the intrinsic type layer and the n-type layer. It is understood that in other embodiments of the invention, a process chamber may be adapted to deposit both a p-type layer and an intrinsic type layer.

The invention claimed is:
1. A method of forming a thin film multi-junction solar cell over a substrate, comprising:
   forming a first p-i-n junction, comprising:
      forming a p-type amorphous silicon layer over the substrate;
      forming an intrinsic type amorphous silicon layer over the p-type amorphous silicon layer; and
      forming a first n-type silicon layer over the intrinsic type amorphous silicon layer; and
   forming a second p-i-n junction over the first p-i-n junction, comprising:
      forming a p-type microcrystalline silicon layer;

forming an amorphous silicon barrier layer over the p-type microcrystalline silicon layer;
forming an intrinsic type microcrystalline silicon layer over the amorphous silicon barrier layer, wherein forming the intrinsic type microcrystalline silicon layer comprises:
   forming a first region of the intrinsic type microcrystalline silicon layer at a first deposition rate;
   forming a second region of the intrinsic type microcrystalline silicon layer over the first region of the intrinsic type microcrystalline silicon layer at a second deposition rate higher than the first deposition rate; and
   forming a third region of the intrinsic type microcrystalline silicon layer over the second region of the intrinsic type microcrystalline silicon layer at a third deposition rate lower than the second deposition rate; and
forming a second n-type silicon layer over the intrinsic type microcrystalline layer.

2. The method of claim 1, wherein the first p-i-n junction is formed over a tin oxide transparent conducting oxide layer.

3. The method of claim 1, wherein the first region of the intrinsic type microcrystalline silicon layer is formed to a thickness between about 10 Å and about 500 Å, wherein the second region of the intrinsic type microcrystalline silicon layer is formed to a thickness between about 10,000 Å and about 30,000 Å, and wherein the third region of the intrinsic type microcrystalline silicon layer is formed to a thickness between about 10 Å and about 500 Å.

4. The method of claim 1, wherein the first deposition rate is between about 100 Å/minute and about 350 Å/minute, wherein the second deposition rate is between about 400 Å/minute and about 1500 Å/minute, and wherein the third deposition rate is between about 100 Å/minute and about 350 Å/minute.

5. The method of claim 1, wherein the p-type amorphous silicon layer of the first p-i-n junction is formed to a thickness between about 60 Å and about 300 Å; wherein the intrinsic type amorphous silicon layer of the first p-i-n junction is formed to a thickness between about 1,500 Å and about 3,500 Å; and wherein the n-type silicon layer of the first p-i-n junction is formed to a thickness between about 100 Å and about 400 Å.

6. The method of claim 1, wherein the p-type microcrystalline silicon layer of the second p-i-n junction is formed to a thickness between about 100 Å and about 400 Å; wherein the amorphous silicon barrier layer is formed to a thickness between about 20 Å and about 100 Å; wherein the intrinsic type microcrystalline silicon layer of the second p-i-n junction is formed to a thickness between about 10,000 Å and about 30,000 Å; and wherein the second n-type silicon layer is formed to a thickness between about 100 Å and about 500 Å.

7. The method of claim 1, wherein the first p-i-n junction is formed in a first process system comprising a first process chamber and a second process chamber.

8. The method of claim 1, wherein the first n-type silicon layer and the second n-type silicon layer are an n-type amorphous silicon layer or an n-type microcrystalline silicon layer.

9. The method of claim 1, wherein the first n-type silicon layer is a dual layer structure comprising an n-type amorphous silicon layer and an n-type microcrystalline silicon layer with the n-type amorphous silicon layer deposited on the intrinsic type amorphous silicon layer.

10. The method of claim 7, wherein the p-type amorphous silicon layer of the first p-i-n junction is formed in the first process chamber of the first process system and wherein the intrinsic type amorphous silicon layer and the n-type silicon layer are formed in the second process chamber of the first process system.

11. The method of claim 7, wherein the second p-i-n junction is formed in a second process system comprising a first process chamber and a second process chamber.

12. The method of claim 11, wherein the p-type microcrystalline silicon layer of the second p-i-n junction is formed in the first process chamber of the second process system and wherein the intrinsic type microcrystalline silicon layer and the second n-type silicon layer of the second p-i-n junction is formed in the second chamber of the second process system.

13. A method of forming a thin film multi-junction solar cell over a substrate, comprising:
   forming a first p-i-n junction, comprising:
      forming a p-type amorphous silicon layer over the substrate;
      forming an intrinsic type amorphous silicon layer over the p-type amorphous silicon layer; and
      forming a first n-type silicon layer over the intrinsic type amorphous silicon layer; and
   forming a second p-i-n junction over the first p-i-n junction, comprising:
      forming a p-type microcrystalline silicon layer;
      forming an intrinsic type microcrystalline silicon layer over the p-type microcrystalline silicon layer, wherein forming the intrinsic type microcrystalline silicon layer comprises:
         forming a seed layer over the p-type microcrystalline silicon layer;
         forming a first region of the intrinsic type microcrystalline silicon layer at a first deposition rate;
         forming a second region of the intrinsic type microcrystalline silicon over the first region of the intrinsic type microcrystalline silicon layer at a second deposition rate higher than the first deposition rate; and
         forming a third region of the intrinsic type microcrystalline silicon layer over the second region of the intrinsic type microcrystalline silicon layer at a third deposition rate lower than the second deposition rate; and
      forming a second n-type silicon layer over the intrinsic type microcrystalline layer.

14. The method of claim 13, wherein the first region of the intrinsic type microcrystalline silicon layer is formed to a thickness between about 10 Å and about 500 Å, wherein the second region of the intrinsic type microcrystalline silicon layer is formed to a thickness between about 10,000 Å and about 30,000 Å, and wherein the third region of the intrinsic type microcrystalline silicon layer is formed to a thickness between about 10 Å A and about 500 Å.

15. The method of claim 13, further comprising forming an amorphous silicon barrier layer between the p-type microcrystalline silicon layer and the seed layer.

16. The method of claim 13, wherein the seed layer is formed to a thickness between about 20 Å and about 500 Å.

17. The method of claim 13, wherein the first deposition rate is between about 100 Å/minute and about 350 Å/minute, wherein the second deposition rate is between about 400 Å/minute and about 1500 Å/minute, and wherein the third deposition rate is between about 100 Å/minute and about 350 Å/minute.

18. The method of claim 13, wherein forming a first p-i-n junction, comprises:

providing a silicon containing gas at a flow rate between about 10 sccm/L and about 200 sccm/L, hydrogen gas at a flow rate between about 100 sccm/L and about 1,000 sccm/L, a p-type dopant between about 0.05 sccm/L and about 1 sccm/L, and RF power between 15 milliWatts/cm$^2$ and about 200 milliWatts/cm$^2$ to form the p-type amorphous silicon layer over the substrate;

providing a silicon containing gas at a flow rate between about 100 sccm/L and about 200 sccm/L, hydrogen gas at a flow rate between about 100 sccm/L and about 3,000 sccm/L, and RF power between 15 milliWatts/cm$^2$ and about 250 milliWatts/cm$^2$ to form the intrinsic type amorphous silicon layer over the p-type amorphous silicon layer; and providing a silicon containing gas at a flow rate between about 1 sccm/L and about 250 sccm/L, hydrogen gas between about 100 sccm/L and about 5,000 sccm/L, an n-type dopant between 0.005 sccm/L and about 0.015 sccm/L to form the n-type silicon layer over the intrinsic type amorphous silicon layer.

19. The method of claim 15, wherein the amorphous silicon barrier layer is formed to a thickness between about 20 Å and about 100 Å.

20. The method of claim 18, wherein forming a second p-i-n junction over the first p-i-n junction, comprises:

providing a silicon containing gas at a flow rate between 1 sccm/L and about 20 sccm/L, hydrogen gas at a flow rate between 100 sccm/L and about 6,000 sccm/L, a p-type dopant at a flow rate between 0.005 sccm/L and about 0.05 sccm/L, RF power between 50 milliWatts/cm$^2$ and about 700 milliWatts/cm$^2$ to form the p-type microcrystalline silicon layer over the n-type silicon layer;

providing a silicon containing gas at a flow rate between about 1,000 sccm and about 3,000 sccm, hydrogen gas at a flow rate between about 100,000 sccm and about 300,000 sccm, and RF power between 0.2 Watts/cm$^2$ and about 0.6 Watts/cm$^2$ to form the first region of the intrinsic type microcrystalline silicon layer over the seed layer;

providing a silicon containing gas at a flow rate between about 1,000 sccm and about 6,000 sccm, hydrogen gas at a flow rate between about 200,000 sccm and about 600,000 sccm, and RF power between 0.6 Watts/cm$^2$ and about 0.9 Watts/cm$^2$ to form the second region of the intrinsic type microcrystalline silicon layer over the first region of the intrinsic type microcrystalline silicon layer;

providing a silicon containing gas at a flow rate between about 1,000 sccm and about 3,000 sccm, hydrogen gas at a flow rate between about 100,000 sccm and about 300,000 sccm, and RF power between 0.2 Watts/cm$^2$ and about 0.6 Watts/cm$^2$ to form the third region of the intrinsic type microcrystalline silicon layer over the second region of the intrinsic type microcrystalline silicon layer; and providing a silicon containing gas at a flow rate between about 100 sccm/L and about 300 sccm/L, hydrogen gas at a flow rate between about 100 sccm/L and about 2000 sccm/L, an n-type dopant between about 0.05 sccm/L and about 1.5 sccm/L, and RF power between about 100 milliWatts/cm$^2$ and about 900 milliWatts/cm$^2$ to form the n-type silicon layer over the intrinsic type microcrystalline silicon layer.

* * * * *